(12) United States Patent
Guerrero

(10) Patent No.: US 6,301,113 B1
(45) Date of Patent: Oct. 9, 2001

(54) RETAINER CLIP FOR HEAT SINK FOR ELECTRONIC COMPONENTS

(75) Inventor: Fred Guerrero, Oxnard, CA (US)

(73) Assignee: PSC Computer Products, Inc., Oxnard, CA (US)

( * ) Notice: Subject to any disclaimer, the term of this patent is extended or adjusted under 35 U.S.C. 154(b) by 0 days.

(21) Appl. No.: 09/566,104

(22) Filed: May 5, 2000

Related U.S. Application Data

(60) Provisional application No. 60/133,219, filed on May 7, 1999.

(51) Int. Cl.[7] .............................. H05K 7/20; F16B 13/00
(52) U.S. Cl. .......................... 361/704; 257/719; 361/710; 361/719; 361/720
(58) Field of Search .................. 24/295–296, 546, 24/464, 473, 457, 458, 459, 472, 563, 517, 572, 531, 453, 575, 625; 165/80.3, 80.2, 185; 174/16.3; 257/718–719, 726–727; 248/316.1, 316.7, 505, 510; 361/704, 707, 709–710, 719–720; 411/552, 508–510, 913; 403/408.1

(56) References Cited

U.S. PATENT DOCUMENTS

| | | | |
|---|---|---|---|
| 2,515,827 | * | 7/1950 | Howard .................................. 24/453 |
| 5,384,940 | | 1/1995 | Soule et al. . |
| 5,730,210 | | 3/1998 | Kou . |
| 5,870,286 | | 2/1999 | Butterbaugh et al. . |
| 5,881,800 | | 3/1999 | Chung . |
| 6,101,096 | * | 8/2000 | Macgregor et al. ................. 361/720 |
| 6,112,378 | * | 9/2000 | Lee ........................................ 24/458 |

\* cited by examiner

Primary Examiner—Gregory Thompson
(74) Attorney, Agent, or Firm—Paul Adams; Andrea L. Mays

(57) ABSTRACT

A retainer clip for retaining a component to a board and a handle for handling the same.

4 Claims, 5 Drawing Sheets

RETAINER CLIP FOR HEAT SINK FOR ELECTRONIC COMPONENTS

CROSS-REFERENCE TO RELATED APPLICATIONS

This application claims the benefit of the filing of U.S. Provisional Patent Application Ser. No. 60/133,219, entitled "Retainer Clip for Heat Sink for Electronic Components," filed on May 7, 1999, and the specification thereof is incorporated herein by reference.

BACKGROUND OF THE INVENTION

1. Field of the Invention (Technical Field):

The present invention relates to retaining devices for heat sinks for electronic components.

2. Background Art:

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

It is well known in the art to use heat sinks for removing heat generated by electronic components in various types of electronic equipment, such as computers, televisions, stereo, etc. Heat sinks are typically formed so as to comprise a flat plate with a plurality of fins disposed at a right angle to the flat plate and preferably formed integral therewith, such as by extrusion or the like. In use, the flat plate of the heat sink is in direct contact with a component and for that reason may have the same size and shape as the body of the component. In order to effect good heat transfer from the surface of the electronic component to the base plate of the heat sink, it is desirable to bias the two surfaces into contact. Such contact should withstand the various forces to which the electronic equipment may be subject, such as shocks received in transport of the electronic equipment. Moreover, such electronic equipment may be in service for many years, and it is desirable that the biased contact be maintained over such extended period of time. Furthermore, since the heat sink and component may be subjected to various operating temperatures, it is desirable that the effective heat transfer contact be unaffected by such temperature changes.

In order to effect this contact, it may initially appear that using a standard fastener of some type may be suitable. However, there is an additional consideration in the retention of the heat sink to the component, which is the necessity for the retaining device to be inexpensive, and extremely easy to insert and de-insert. The latter is particularly a problem since it affects both assembly of the heat sink to the component during initial manufacture of the electronic equipment and throughout the life of the equipment it may be necessary to d-insert the retainer device so as to release the heat sink from the component, such as may be required where the component has failed and must be replaced.

Various types of heat sink retainer devices are disclosed in the prior art which attempt to meet these desiderata. For example, in U.S. Pat. No. 5,881,800, there is shown a heat sink device with retainer clips formed from plastic and having an "arrowhead locating bolt" that passes through an opening in the heat sink and a corresponding opening in a printed circuit board so as to clamp the two together. In U.S. Pat. No. 5,870,286, there is shown a heat sink and retaining clips comprising push pin assemblies and a separate compression spring that biases the heat sink and base plate of the heat sink and a printed circuit board into contact. Each of the push pin assemblies include flexible legs that support locking barbs. Similar devices are shown in U.S. Pat. Nos. 5,730,210 and 5,384,940.

While these retainer dips for heat sinks may be suitable for the particular applications as shown in the subject patents, it is desirable to have as much spring force to bias the heat sink and component together, and the present invention provides for a unique configuration that creates a sustained and substantial biasing pressure.

SUMMARY OF THE INVENTION (DISCLOSURE OF THE INVENTION)

A primary object of the present invention is to provide a heat sink retaining clip having a substantial continuous biasing force for pressing the heat sink and electronic component together.

Another object of the present invention is to provide a heat sink that is formed from plastic or other inexpensive material using an inexpensive manufacturing method such as plastic injection molding.

Still another object of the present invention is to provide a heat sink that is very easily inserted so as to secure the heat sink and electronic component to one another, but which may also be easily released in the event that it is desirable to disconnect the heat sink from the component.

Yet another advantage of the present invention is to provide a heat sink retainer device that may be inserted manually without the use of any tool.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

This invention relates to a device for retaining a heat sink in heat conducting relationship with an electronic component, for example, a component mounted on a printed circuit board used in an electronic device such as a computer.

Figure 1:
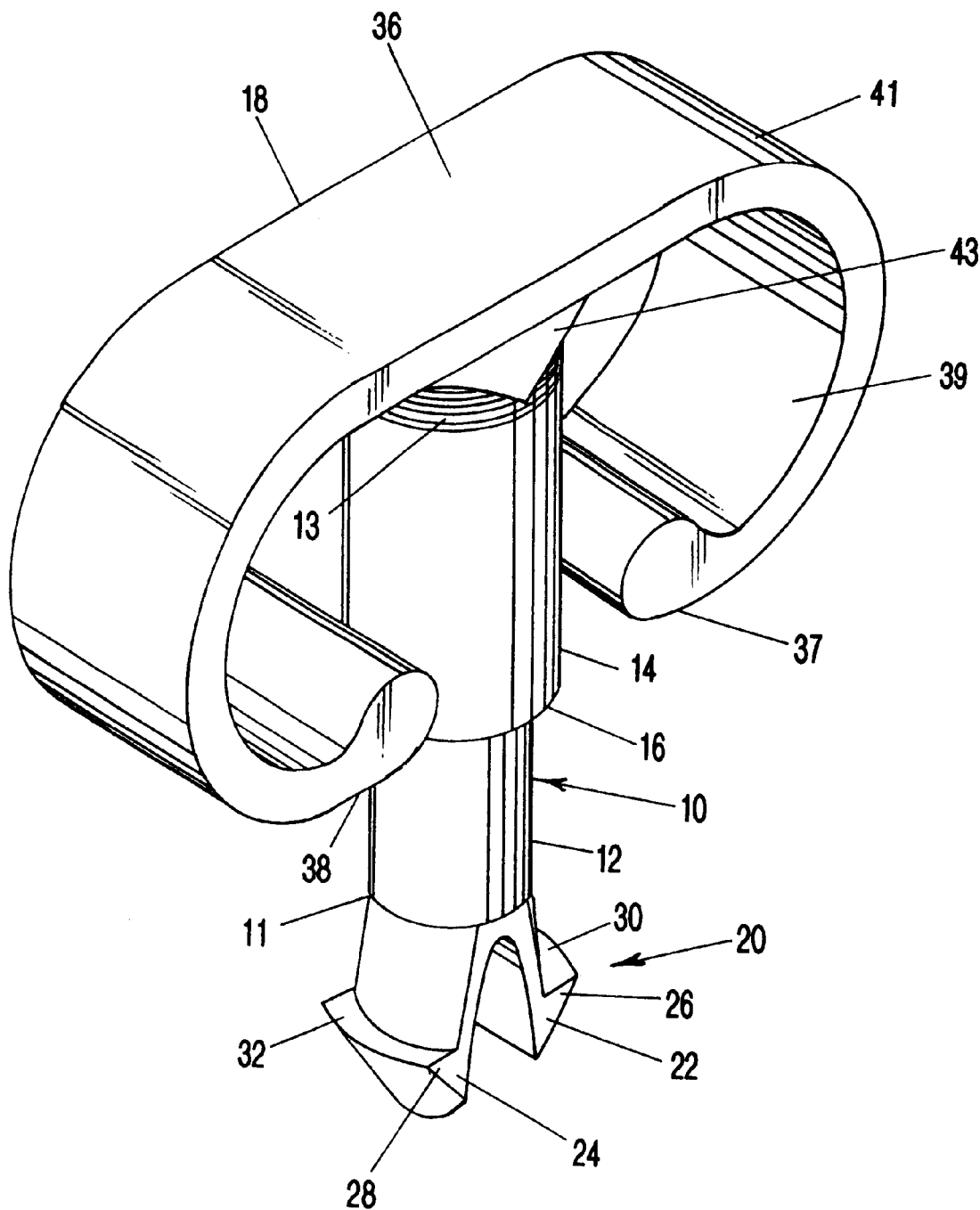
FIG. 1 is a perspective view of a retainer clip according to a preferred embodiment of the present invention.
Figure 2:
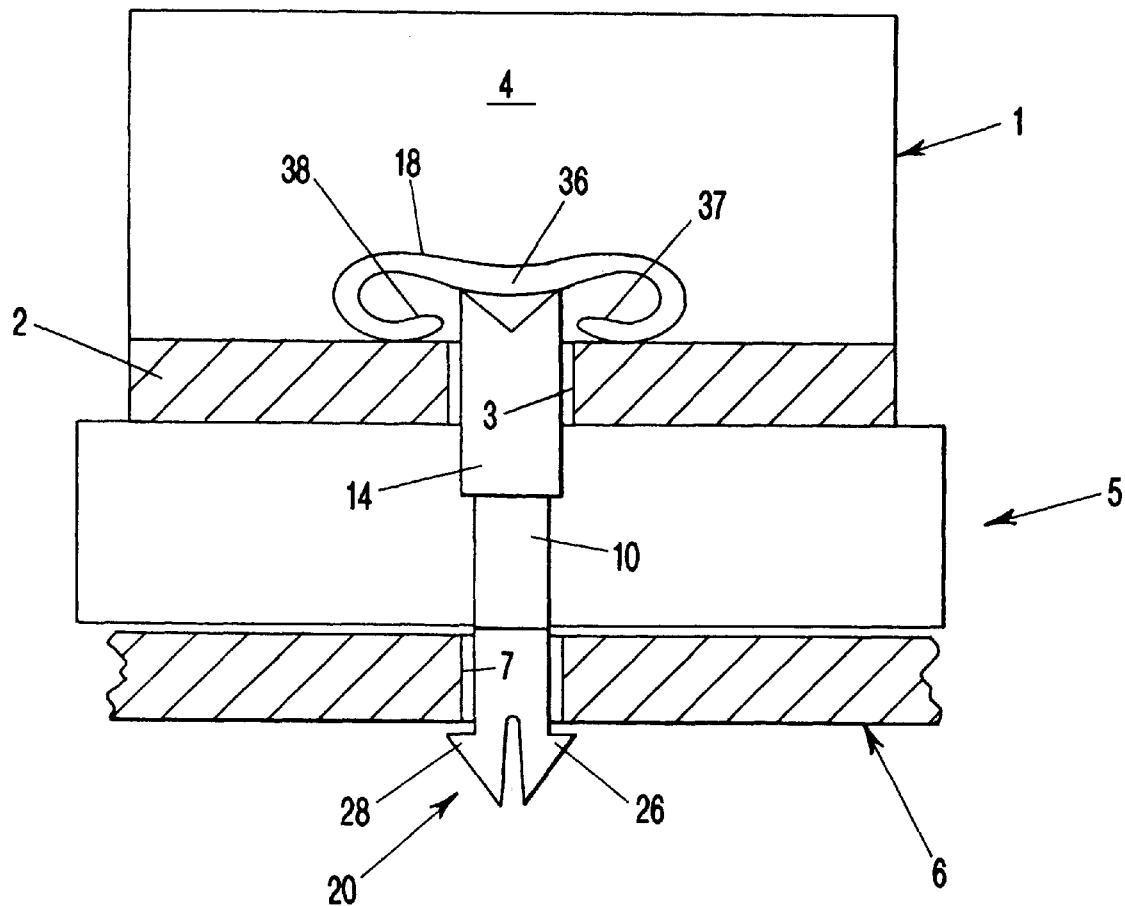
FIG. 2 is a side elevation view partly in section of a heat sink and the retainer clip shown in FIG. 1.
Figure 3:
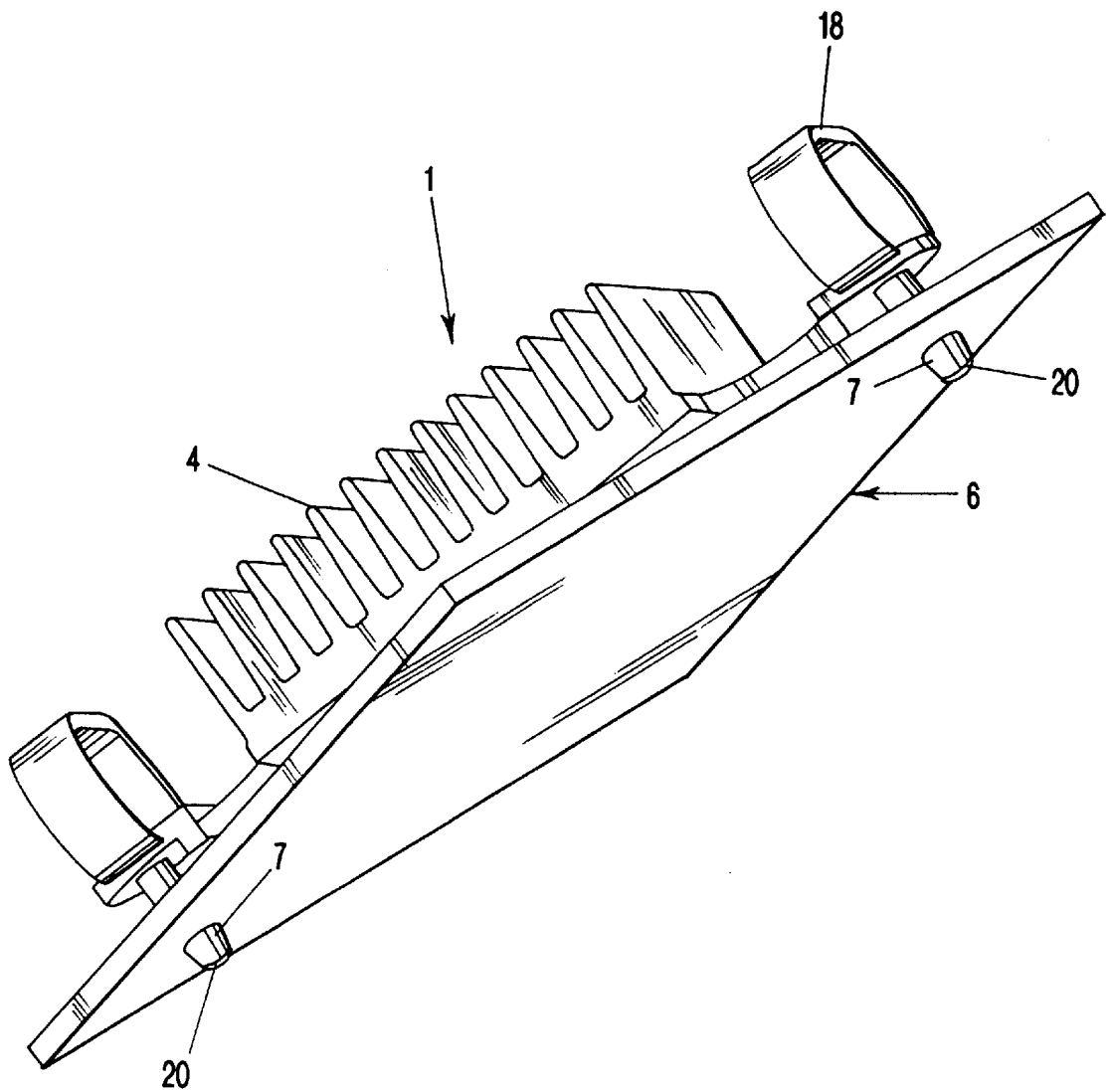
FIG. 3 is a perspective view of the heat sink secured to a printed circuit board by two retainer dips according to a preferred embodiment of the present invention.

A preferred embodiment of a retainer clip, according to the present invention, is shown in FIG. 1. In this preferred embodiment, the clip comprises a substantially non-electrically conductive material, such as, but not limited to, plastic. In FIGS. 2 and 3, a heat sink as known in the computer and electronic arts is shown. The heat sink 1 shown in FIGS. 2 and 3 is typical and representative of heat sinks used commercially. This heat sink comprises a substantially flat base-plate 2 from which a plurality of fins 4 project upwardly. The fins are optionally integral with the base or otherwise secured to the base. The purpose of the fins is primarily to increase the surface area of the heat sink; other considerations that may influence heat sink design include aerodynamics of the heat sink and/or structural integrity of the heat sink. The base of the heat sink comprises a lower surface that contacts an electronic component. Electronic components typically experience current induced heating, for example, but not limited to, resistive and/or electromagnetic heating. The heat sink is designed to dissipate heat from the electronic component. In many applications, electronic components, such as those using heat sinks, are secured to a board, for example, a printed circuit board. Where an electronic component is secured to a circuit board and use of a heat sink is desirable, a clip of the present invention is useful for retaining the heat sink to the circuit board. In most instances, a circuit board will have an aperture suitable for receiving the clip.

Referring to FIG. 1, the dip comprises a shaft 10 comprising a lower end 11 and an upper end 13. The shaft 10 which is preferably cylindrical in shape comprises at least one diameter over the length of the shaft. In the preferred embodiment of FIG. 1, the shaft 10 is formed with two diameters: a smaller diameter 12 over a length extending from the lower end 11 to approximately the mid-point of the shaft and a larger, or full, diameter 14 extending from approximately the mid-point of the shaft to the upper end 13. Thus, according to the preferred embodiment shown in FIG. 1, the shaft 10 comprises a region of reduced diameter 12 and a region of full diameter 14. Of course, other embodiments are within the scope of the present invention wherein the shaft optionally comprises a plurality of diameters, for example, but not limited to, Increasing, decreasing, and/or increasing and decreasing diameters. Additionally, the shaft cross-section is not limited to a circular cross-section, for example, it may have other cross-sectional shapes such as polygonal, substantially polygonal, and/or elliptical, all of which are within the scope of the present invention.

Referring again to FIG. 1, the intersection of the full diameter region and smaller diameter region of the shaft form a shoulder 16 at approximately the mid-point of the shaft 10. In alternative embodiments, the position of the shoulder is optionally closer to a lower end or alternatively the upper end.

The preferred embodiment of FIG. 1 also shows, at the upper end 13 of the central shaft 10, an integrally molded, or alternatively removably attachable, C-shaped handle 18, which may be gripped by hand or a tool so as to facilitate handling of the dip. As mentioned above, a circuit board may have an aperture for receiving the dip; accordingly, a handle facilitates insertion of the lower end 11 of the dip into the aperture. In this particular preferred embodiment the handle is also convenient for gripping the clip to facilitate handling of the clip. The C-shaped handle 18 comprises a flat portion 36 connecting semi-circular opposing end sections 37, 38.

The handle further comprises an inward facing surface 39 and an outward facing surface 41. In a preferred embodiment, the handle includes a ridge 43 that is connected to the upper end 13 of the shaft. The handle of this particular embodiment is alternatively integral with the shaft wherein the handle 18, optionally a ridge 43 and the shaft 10 comprise a single, one-piece unit that, in elevation view is shaped like the letter "T" with the free end of each of the T crossbar arm folded down and back.

Affixed to, or alternatively integral with, the lower end 11 of the central shaft is a retainer section 20 for insertion through, for example, an aperture in a circuit board. In the preferred embodiment of the present invention, as shown in FIG. 1, the retainer section 20 comprises two spaced apart legs 22, 24. In this particular embodiment, the legs are identical; however, the present invention also includes legs that differ in shape and/or size. The retainer section 20 preferably comprises resilient material. Suitable materials include, for example, but are not limited to, plastic and other substantially non-conductive resilient materials. As shown in FIG. 1, when retainer section 20 is in an at-rest or preassembled condition, legs 22, 24 are more spaced apart at the free ends. In this particular embodiment, each leg has a barb shown at 26 and 28, which projects radially outwardly so as to form shoulders shown at 30 and 32. Either one or both of the legs may be resilient. The legs may also be formed of spring steel.

Referring now to FIG. 2, the preferred embodiment of the retainer clip is shown installed. FIG. 2 shows a heat sink 1 having a base plate 2 including an opening 3 and a plurality of fins, one of which is shown at 4. The base plate of the heat sink is disposed on the top surface of a component shown generally at 5, secured to a printed circuit board shown at 6, in a manner well known in the art. Circuit board 6 also has an opening or aperture 7. To assemble the heat sink to the printed circuit board so as to positively bias the heat sink 1 into engagement with the upper surface of electronic component 5, the lower section 20 of the retainer dip is inserted through the opening 3 in the base plate of the heat sink until the barbs 26, 28 are below the lower surface of the base plate 2. In production manufacturing, it may be desirable to size the opening of the apertures 3 in the base plate 2 so that once the lower section 20 passes through the opening 3, the dip is captured and together with the heat sink comprises a sub-assembly to be subsequently used in securing the heat sink to the component and printed circuit board. Alternatively, the opening 3 may be large enough so that the barbs 26, 28 will not engage the lower surface of the base plate 2 and the entire retainer dip may be inserted and de-inserted through the aperture 3 without capture.

To complete assembly of the heat sink with the retainer dip to the component 5 and printed circuit board 6, the lower section 20 of the retainer dip is pressed against the upper edge of the aperture 7 in the printed circuit board, continued force pushes one or both legs 22, 24 toward one another, permitting the barbs 30, 32 to pass through the aperture 7. Due to the resilient action of the legs 22, 24, once the barbs pass the lower surface of the printed circuit board, the legs will spring outwardly so that the shoulders 30, 32 will bear against the lower surface of the printed circuit board 6 in the area immediately adjacent to the aperture 7. In the process of installing the retainer clip, the vertical dimension from the bottom of printed circuit board 6, to the top of the base plate 2 of the heat sink 1, is chosen such that in order to force the lower section 20 through the aperture 7 so that the barbs 26, 28 are positioned beneath the printed circuit board, the outer ends 37, 38 of the C-shaped handle 18 are biased upwardly.

This will slightly deform the folded-back portion of the arms 37, 38 providing a biasing force on the plate 2 against the component 5. It may also cause some deflection in the center section 36, which is normally flat. With proper dimensioning, the lower edges of ends 37, 38 will bear against the upper surface of the base plate 2. Thus, between the barbs 30, 32 beneath the printed circuit board 6 and the outer ends 37, 38 of the C-shaped section 18, the heat sink and printed circuit board are biased toward one another, resulting in the lower surface of the base plate 2 of the heat sink 1 being biased in heat-conducting engagement with the upper surface of electronic component 5.

The completed assembly may be seen from underneath the printed circuit board 6 in FIG. 3.

The preferred embodiment of the present invention shown in FIGS. 1, 2 and 3 comprises two feet; however, alternative embodiments of the present invention may optionally comprise more than two feet. For example, a three-foot embodiment is within the scope of the present invention wherein the three feet are spaced at 120° angles. Of course, other number of feet and unequal spacing and/or centering of feet in reference to the shaft are also within the scope of the present invention.

Figure 4:
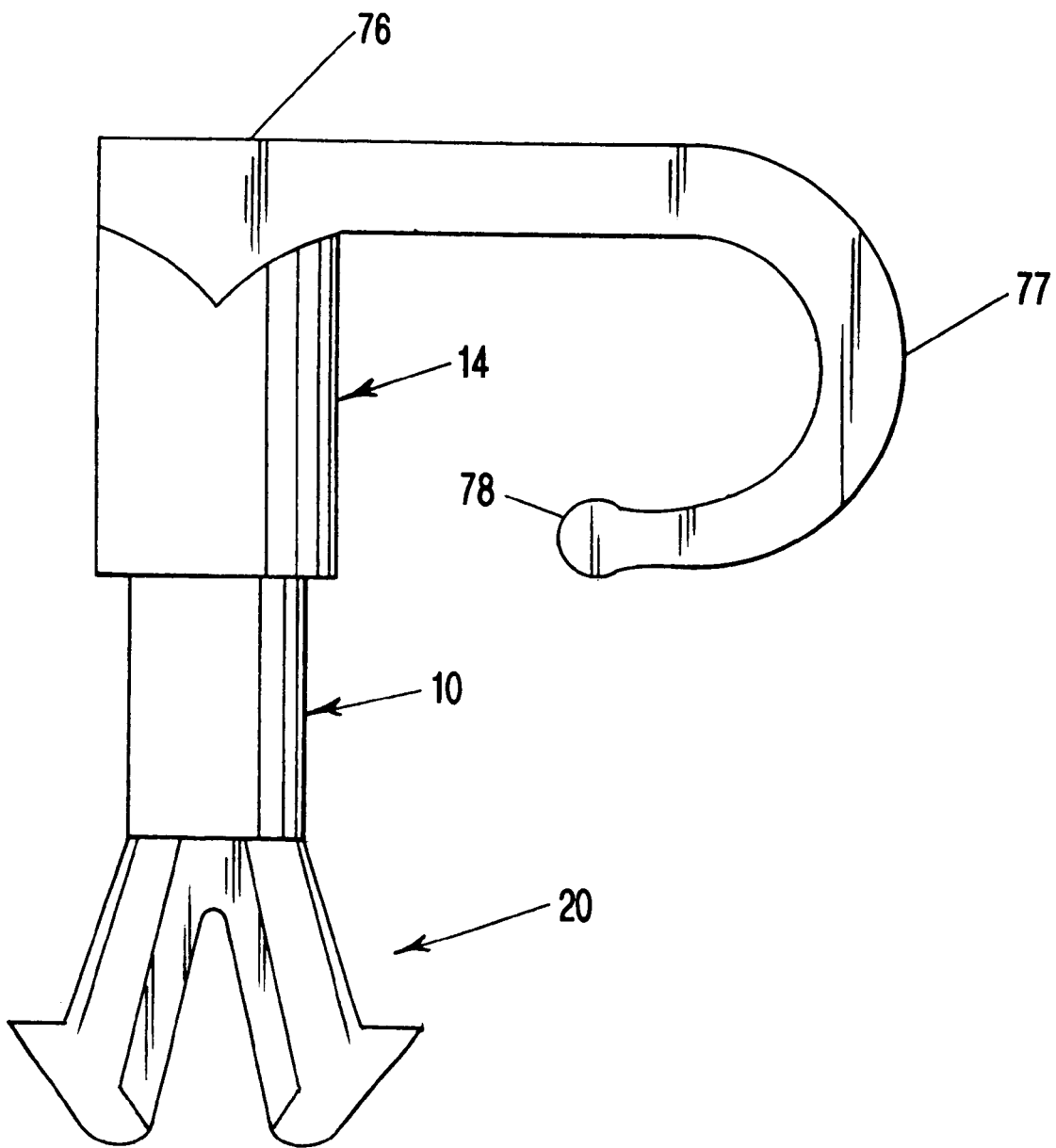
FIG. 4 is a first alternative embodiment of a retainer dip.

An alternative embodiment of a retainer clip in accordance with the present invention is shown in FIG. 4. The shaft 10, lower section 20, and upper larger diameter shaft portion 14 are identical in all respects to the first embodiment shown in FIG. 1. In this configuration, because of space considerations, and because a lesser biasing force may be necessary, the handle 18 of the retainer clip has a J section comprising a straight portion 76 and a curved portion 77 terminating in an end portion 78. In other respects, the alternative embodiment is constructed and is assembled similar to the preferred embodiment shown in FIG. 1.

Figure 5:
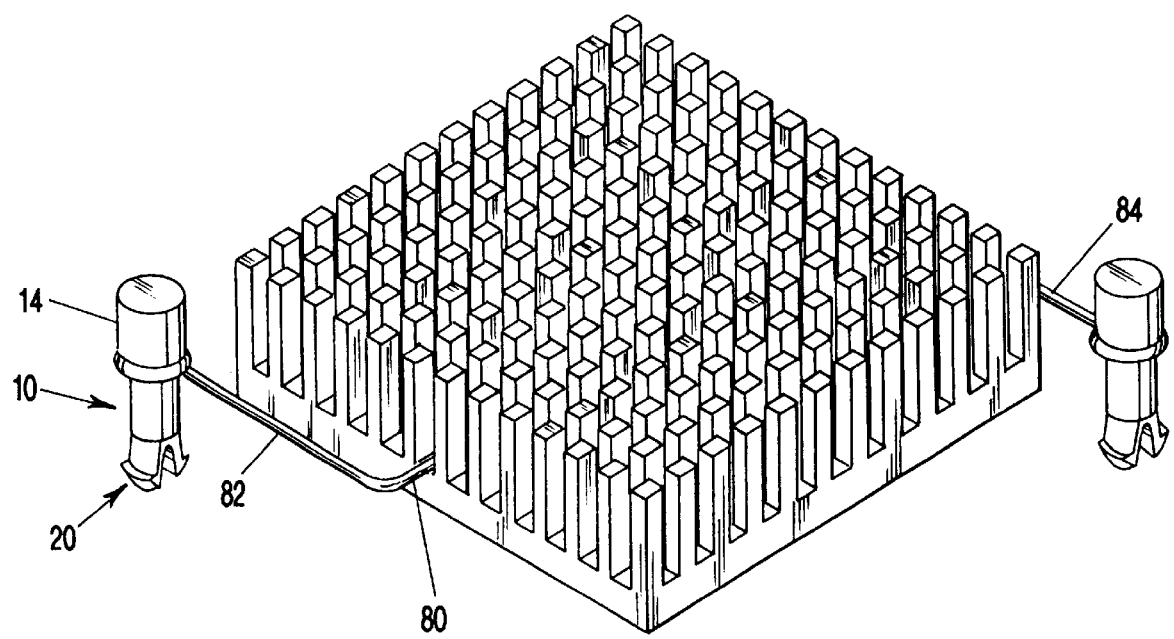
FIG. 5 is a perspective view of a second alternative embodiment of a retainer clip.

Another embodiment of the present invention may cooperate with a wire-form retainer 80 as shown in FIG. 5. Retainer dips are used in conjunction with the wire-form retainer 80 which, as shown in FIG. 5, for the particular heat sink shown, has a central portion which may be inserted between two rows of fins and two arms shown at 82 and 84, which extend from the central portion at opposite right angles. Each of the arms 82, 84, comprise, for example, a loop for accommodating a shaft formed with an innerdiameter that is substantially the same as the outer-diameter of the reduced section 12 of shaft 10 so that section 12 is enclosed by the loop and is forced against shoulder 16 after the dip is inserted into a circuit board. Consequently, when the wire-form retainer 80 is secured through the retainer dips as shown in FIG. 5, and the clips are then forcibly inserted into the printed circuit board, as shown best in FIG. 3, the wire-form retainer 80 will bias the heat sink in contact with the electronic component so as to maximize the heat conducting capability of the heat sink.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A retainer dip for biasing a heat sink having a base plate with at least one aperture and at least one fin, toward an electronic component mounted on a circuit board, including at least one aperture, comprising:

a shaft including a lower end, an upper end, an axis and at least two different cross-sections;

a handle mounted on the upper end of said shaft including at least one semi-circular section formed from resilient material, one end of said semi-circular section fixedly connected to said shaft and the other end free; and a retainer section adjacent said lower end of said shaft formed from a resilient material and at least two spaced-apart legs wherein at least one of said legs responds to an applied force that moves said leg towards at least one other leg thereby allowing for insertion of said retainer section into an aperture in the board.

2. The clip of claim 1 wherein each of said at least two legs includes a barb projecting radially outwardly from the axis of said shaft.

3. The dip of claim 1 wherein said handle includes two semi-circular ends, each connected at one end to a flat portion connected to said upper end of said shaft.

4. A T-shaped retainer clip for biasing a heat sink including a base plate with at least one aperture toward an electronic component mounted on a circuit board with at least one aperture comprising:

a shaft;

a crossbar including resilient folded back end sections;

a retainer section on the lower end of said shaft comprising at least one resilient leg with an outwardly directly barb;

said clip sized relative to the position of the heat sink base plate and circuit board so that when said shaft retainer section passes through the plate and board apertures so that the board prevents upward movement of said shaft, said resilient folded-back end sections bear against the plate so as to bias the plate toward the circuit board.

* * * * *